United States Patent
Mendonsa et al.

(10) Patent No.: US 11,540,421 B2
(45) Date of Patent: Dec. 27, 2022

(54) DATA STORAGE DEVICE (DSD) AND COOLING SYSTEM FOR DSD CHASSIS

(71) Applicant: Seagate Technology LLC, Fremont, CA (US)

(72) Inventors: Riyan A. Mendonsa, Edina, MN (US); Brett R. Herdendorf, Mound, MN (US); Iraj Jabbari, La Jolla, CA (US); Kevin Van Pelt, Longmont, CO (US)

(73) Assignee: Seagate Technology LLC, Fremont, CA (US)

(*) Notice: Subject to any disclaimer, the term of this patent is extended or adjusted under 35 U.S.C. 154(b) by 40 days.

(21) Appl. No.: 17/018,910

(22) Filed: Sep. 11, 2020

(65) Prior Publication Data

US 2022/0087074 A1   Mar. 17, 2022

(51) Int. Cl.
 *G05D 23/00* (2006.01)
 *H05K 7/20* (2006.01)
 *G06F 1/20* (2006.01)

(52) U.S. Cl.
 CPC ......... *H05K 7/20836* (2013.01); *G06F 1/206* (2013.01); *H05K 7/20436* (2013.01)

(58) Field of Classification Search
 CPC  H05K 7/20836; H05K 7/20436; G06F 1/206; G06F 1/185; G06F 1/187; G06F 3/0658; G06F 1/20; G11B 33/126; G11B 33/128; G11B 33/1413
 See application file for complete search history.

(56) References Cited

U.S. PATENT DOCUMENTS

| | | | |
|---|---|---|---|
| 7,251,132 B1* | 7/2007 | Paul | G06F 1/187 248/618 |
| 7,495,906 B2 | 2/2009 | Fujie et al. | |
| 7,859,839 B2 | 12/2010 | Wada | |
| 8,238,084 B2* | 8/2012 | Chen | G06F 1/1671 361/679.14 |
| 8,804,278 B1 | 8/2014 | Sorenson, III et al. | |
| 9,141,153 B2 | 9/2015 | Mundt et al. | |
| 9,141,156 B2 | 9/2015 | Ross et al. | |
| 9,326,415 B2 | 4/2016 | Rauline | |
| 9,485,888 B2 | 11/2016 | Bell et al. | |
| 9,552,025 B2 | 1/2017 | Samadiani et al. | |
| 9,615,480 B2 | 4/2017 | Pronozuk et al. | |
| 9,934,824 B2 | 4/2018 | Sorenson, III et al. | |
| 10,383,257 B2 | 8/2019 | Szeremeta et al. | |
| 10,398,060 B1* | 8/2019 | Beall | G11B 33/00 |
| 10,575,448 B1* | 2/2020 | Lewis | H05K 9/0081 |
| 11,087,782 B1* | 8/2021 | Brown | G11B 5/2457 |

(Continued)

OTHER PUBLICATIONS

Alissa A., et al., "Analysis of airflow imbalances in an open compute high density storage data center", Journal Article, https://www.sciencedirect.com/science/article/pii/S1359431116313308, dated Sep. 5, 2016, 22 pages.

*Primary Examiner* — Zhipeng Wang
(74) *Attorney, Agent, or Firm* — Westman, Champlin & Koehler, P.A.

(57) ABSTRACT

A system includes a data storage drive having a housing with one or more data storage media therein. The housing includes a top cover and a base-deck. The base-deck includes a floor and a frame having a plurality of sides. The data storage drive also includes a printed circuit board assembly (PCBA) mounted on an exterior of one of the plurality of sides of the frame.

20 Claims, 6 Drawing Sheets

(56) References Cited

U.S. PATENT DOCUMENTS

| | | | |
|---|---|---|---|
| 2002/0122296 A1 | 9/2002 | Stone et al. | |
| 2005/0028967 A1* | 2/2005 | Pedoeem | H05K 7/20127 |
| | | | 165/185 |
| 2007/0091559 A1* | 4/2007 | Malone | G06F 1/187 |
| 2007/0133164 A1* | 6/2007 | Xu | G11B 33/12 |
| 2009/0284910 A1* | 11/2009 | Heo | G11B 25/043 |
| | | | 361/679.36 |
| 2011/0194242 A1* | 8/2011 | Hu | H05K 7/1487 |
| | | | 361/679.32 |
| 2012/0291260 A1 | 11/2012 | Cayaban et al. | |
| 2013/0021746 A1 | 1/2013 | Campbell et al. | |
| 2013/0329364 A1* | 12/2013 | Kameno | H05K 7/20572 |
| | | | 361/697 |
| 2015/0348592 A1* | 12/2015 | Kwon | G11B 33/124 |
| | | | 386/358 |
| 2017/0059145 A1* | 3/2017 | Li | G02F 1/1335 |
| 2017/0131750 A1* | 5/2017 | Sato | G06F 1/183 |
| 2017/0181306 A1* | 6/2017 | Shaw | H05K 7/1438 |
| 2018/0062850 A1* | 3/2018 | Anderson | H04L 9/3247 |
| 2018/0279513 A1* | 9/2018 | Tabuchi | G11B 33/142 |
| 2019/0250679 A1 | 8/2019 | Nguyen et al. | |
| 2019/0265608 A1* | 8/2019 | Nishiguchi | G02B 26/122 |

\* cited by examiner

DATA STORAGE DEVICE (DSD) AND COOLING SYSTEM FOR DSD CHASSIS

SUMMARY

In one embodiment, a system is provided. The system includes a data storage device having a housing with one or more data storage media therein. The housing includes a top cover and a base-deck. The base-deck includes a floor and a frame having a plurality of sides. The data storage drive also includes a printed circuit board assembly (PCBA) mounted on an exterior of one of the plurality of sides of the frame.

In another embodiment, a method is provided. The method includes providing a data storage device housing with one or more data storage media therein. The housing includes a top cove and a base-deck. The base-deck includes a floor and a frame having a plurality of sides. The method also incudes mounting a printed circuit board assembly (PCBA) on an exterior of one of the plurality of sides of the frame.

In yet another embodiment, a system is provided. The system includes a data storage device having a housing with one or more data storage media therein. The housing includes a top cover and a base-deck. The base-deck includes a floor and a frame having a plurality of sides. The data storage drive also includes a printed circuit board assembly (PCBA) mounted on an exterior of one of the plurality of sides of the frame or mounted on an exterior of the floor. The system further incudes a thermal energy transport layer thermally coupled to the PCBA.

This summary is not intended to describe each disclosed embodiment or every implementation of the data storage device and cooling system. Many other novel advantages, features, and relationships will become apparent as this description proceeds. The figures and the description that follow more particularly exemplify illustrative embodiments.

DETAILED DESCRIPTION

Embodiments of the disclosure described below relate to data storage devices (DSDs), such as hard disc drives (HDDs), and a cooling system for the DSDs mounted in a chassis in a data center.

As hard disc drives (HDDs) continue to increase in capacity, there is a continuous impetus for increasing tracks per inch (TPI). One issue with increasing TPI is a corresponding increased need for cooling the HDDs, which may lead to substantial vibrational modes from fans used for cooling. This reduces a maximum areal density capability (ADC) potential of the HDD and/or reduces the density of HDDs in a chassis. It also increases the cost of the chassis and power consumption.

The address the above problems, embodiments of the disclosure provide HDDs and chassis that are redesigned such that cooling may be provided from above or below the HDDs, when the HDDs are vertically mounted in the chassis (e.g., a tombstone architecture). In such embodiments, the amount of vibration experienced by the HDDs is reduced by forcing air to move in channels above or below the HDDs and transferring the heat out of the enclosure including the chassis and the HDD. A primary heat source in the HDD is electrical circuitry in a printed circuit board assembly (PCBA) attached on a housing of the HDD. Thus, in some embodiments, the PCBA may be mounted at a location of the HDD housing that permits direct cooling from above or below the HDD when it is mounted in the chassis. One such HDD embodiment is described below in connection with FIG. 1.

Figure 1:
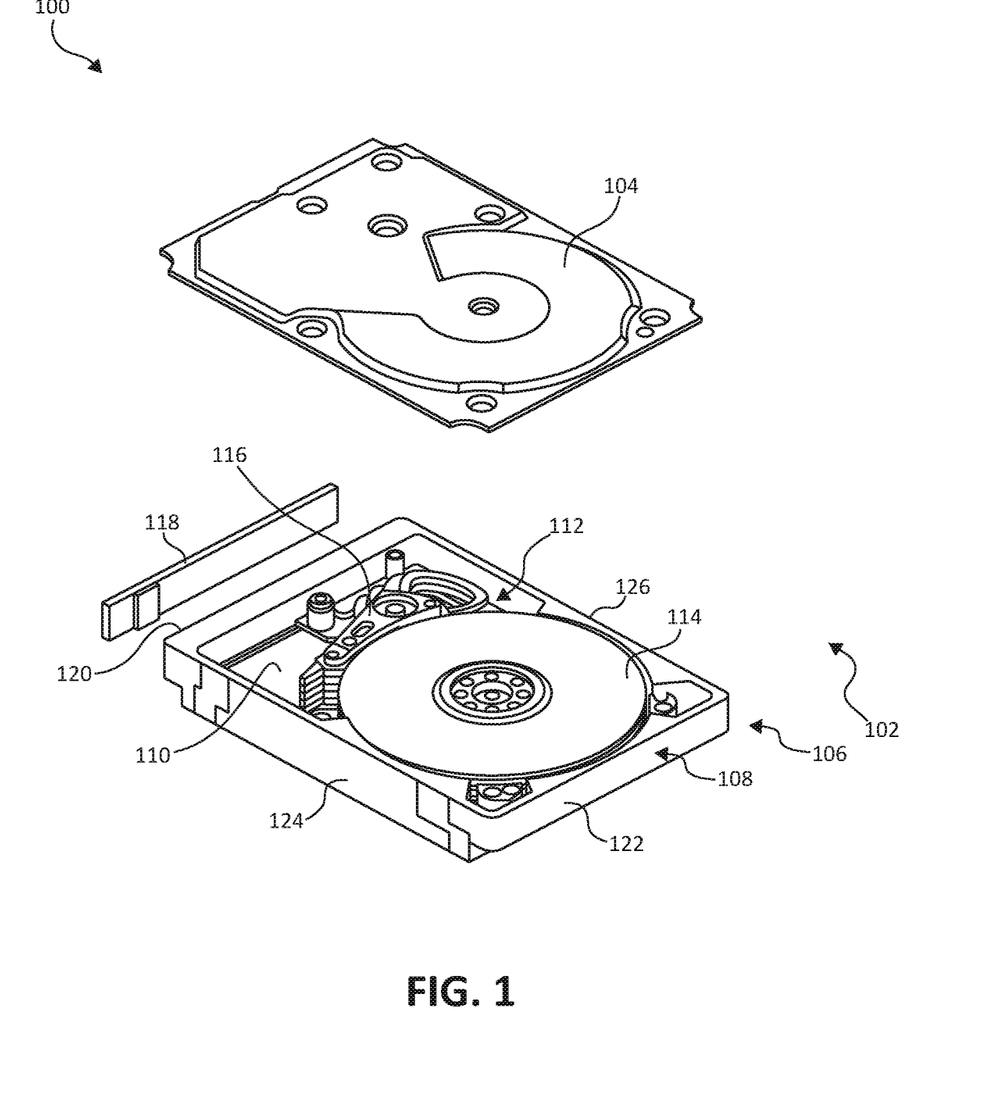
FIG. 1 is an exploded view of a hard disc drive (HDD) in accordance with one embodiment.

FIG. 1 shows an illustrative embodiment of an HDD. The HDD shown in FIG. 1 is for illustration purposes only. Embodiments of the present disclosure are not limited to any particular type of DSD such as the HDD shown in FIG. 1. Embodiments of the present disclosure are illustratively practiced within any number of different types of DSDs.

It should be noted that the same reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

It will be understood that, when an element is referred to as being "connected," "coupled," or "attached" to another element, it can be directly connected, coupled or attached to the other element, or it can be indirectly connected, coupled, or attached to the other element where intervening or intermediate elements may be present. In contrast, if an element is referred to as being "directly connected," "directly coupled" or "directly attached" to another element, there are no intervening elements present. Drawings illustrating direct connections, couplings or attachments between elements also include embodiments, in which the elements are indirectly connected, coupled or attached to each other.

FIG. 1 provides an exploded view of an HDD 100 in accordance with one embodiment. As shown, HDD 100 has a housing 102 that includes a top cover 104 and a base-deck 106. Base-deck 106 includes a frame 108 and a floor 110. In the embodiment of FIG. 1, base-deck frame 108 and base-deck floor 110 are a single piece. However, in other embodiments, base-deck frame 108 and base-deck floor 110 may be two separate pieces. The housing 102, including the base-deck 106 and the top cover 120, may adhere to any of a number of different form factors, including, for example, the 2.5" and 3.5" form factors for HDDs. HDD internals 112, some of which may be mounted on base-deck floor 110, include one or more data storage discs 114 rotated by a spindle motor (not shown) and one or more actuator arms 116 that carry read/write heads that interact with the data storage disc(s) 114. The read/write data signals are carried from/to the read/write head by a flex circuit (not shown). In the interest of brevity, a detailed description of certain components of the HDD internals 112 is not provided.

The housing 102, in combination with HDD internals 112 and a logic board or printed circuit board assembly (PCBA) 118, provide the HDD 100. PCBA 118 may include power supply circuitry, control circuitry to which the flex circuit is coupled, solid state memory elements, etc. As indicated above, such elements included in the PCBA 118 are a primary heat source in the HDD 100. In general, current HDDs have PCBAs mounted on an outer surface of base-deck floor 110, which results in heat being spread over a relatively large portion of the current HDD. Thus, complex cooling mechanisms may have to be used in such current HDDs. In contrast, in the embodiment of FIG. 1, the PCBA 118 is coupled to a first short side 120 of base-deck frame 108. Including the PCBA 118 on base-deck frame short side 120 concentrates the heat source at that end of the HDD 100. In FIG. 1, a second short side of base-deck frame 108, which is proximate to edges of data storage discs 114, is denoted by reference numeral 122. Reference numerals 124 and 126 are used to denote respective first and second long sides of base-deck frame 108. An architecture in which the PCBA, such as 118, is mounted on a side of the base-deck frame, such as base-deck frame side 120, is referred to herein as a toast architecture.

Figure 2:
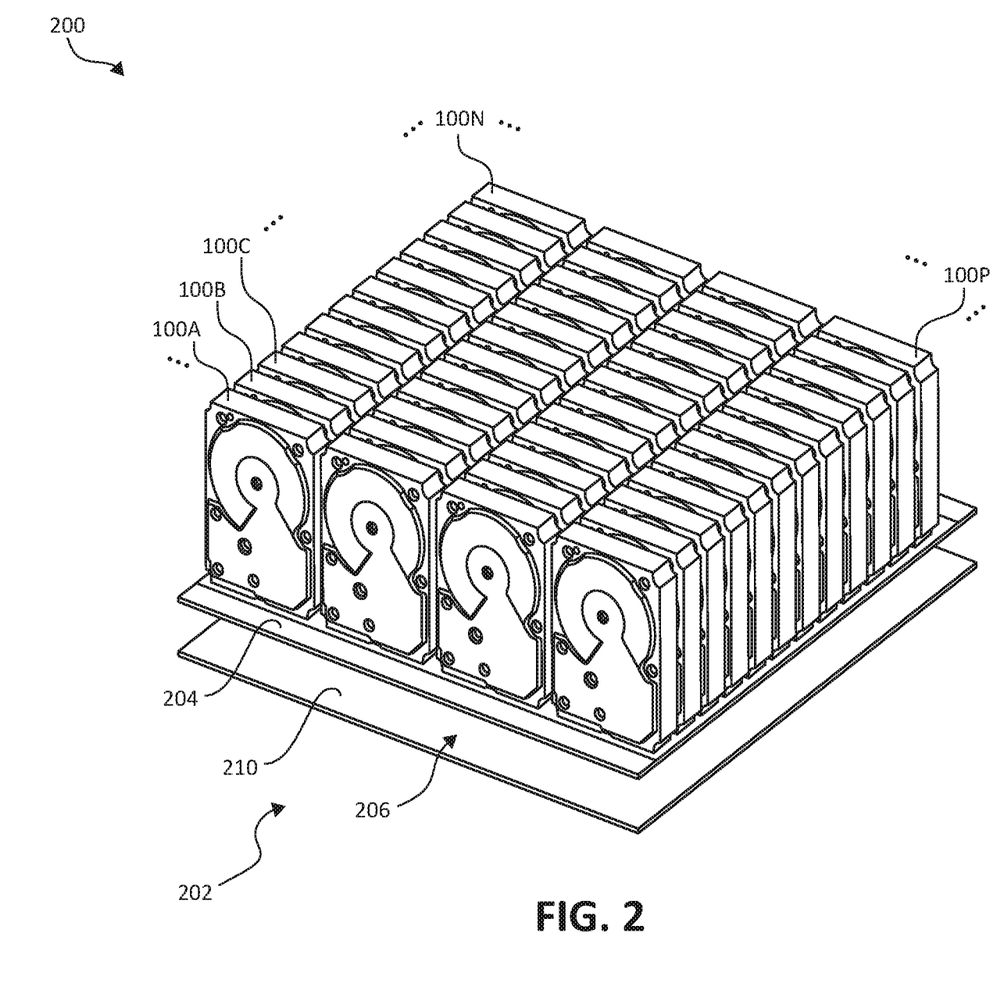
FIG. 2 is a diagrammatic illustration of a data center rack portion that includes multiple HDDs similar to the HDD of FIG. 1.

FIG. 2 is a diagrammatic illustration of a data center rack portion 200 that includes a plurality of HDDs such as 100 of FIG. 1 mounted in a chassis 202 using a tombstone architecture in accordance with one embodiment. A can be seen in FIG. 2, the tombstone architecture involves vertically mounting the HDDs 100A-100N on a backplane 204 of the chassis 202. The backplane 204 is a PCBA within the chassis 202 and routes power and electrical signals back and forth between HDDs 100A-100N and an interface to other data center devices. In some embodiments, the backplane 204 may also serve as a physical support for the HDDs 110A-100N. The mounting of the HDDs 100A-100N is such that the PCBA 118 of each of HDDs 100A-100B is proximate to and faces the backplane 204. A space 206 is included between of bottom 210 of chassis 202 and backplane 204. Since the heat generated in the HDDs 100A-100N is concentrated substantially at and around the PCBAs 118, and therefore near backplane 204, cooling may be focused in the backplane 204 region (e.g., by providing movement of air in space 206). It should be noted that standoffs (not shown) may be included at different points between backplane 204 and chassis bottom 210 to support the backplane 204 and the HDDs 100A-100N over the bottom 210 and thereby create space 206. In some cases, the standoffs or supports may also act as thermal energy transporters. In alternate embodiments, instead of providing space 206 between backplane 204 and chassis bottom 210, the backplane 204 may rest directly on chassis bottom 204.

Figures 3A, 3B:
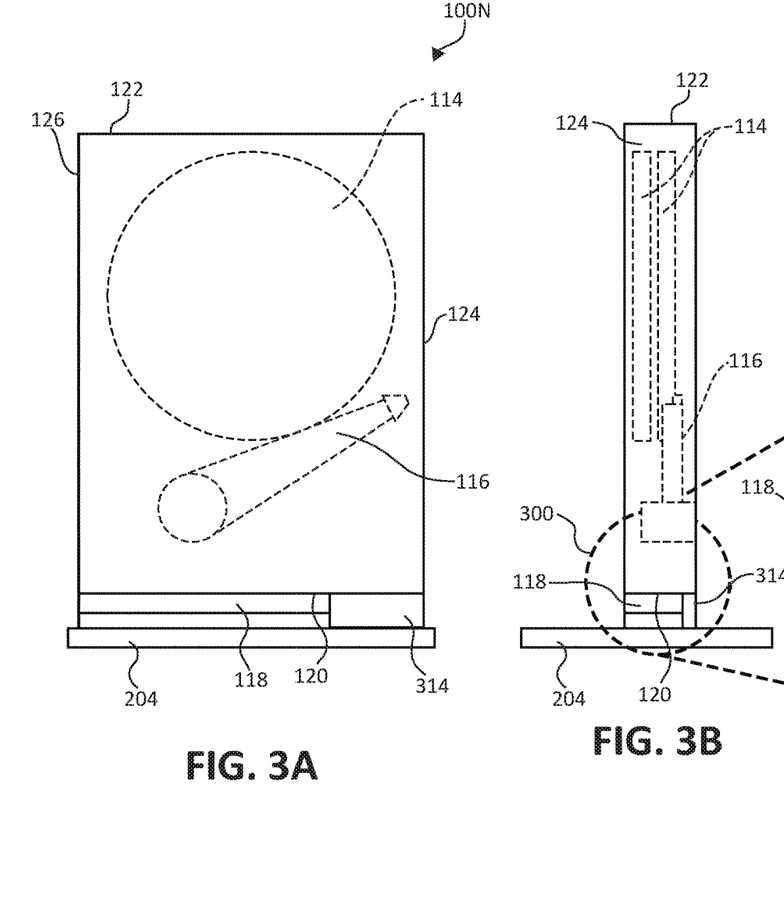
FIG. 3A-3C are diagrammatic illustrations that together illustrate a mounting orientation and mounting details of one of the HDDs of FIG. 2 in accordance with one embodiment.
Figure 3C:
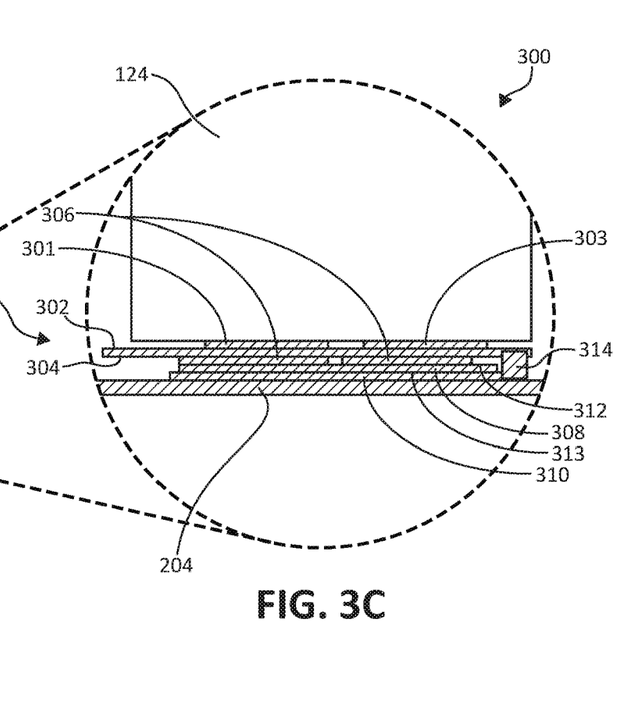

FIG. 3A-3C are diagrammatic illustrations that together illustrate a mounting orientation and mounting details of one of the HDDs (e.g., HDD 100N) of FIG. 2 in accordance with one embodiment. FIG. 3A shows HDD 100N positioned vertically with its top surface (e.g., outer surface of top cover 104) in view. FIG. 3B shows a side view of HDD 100N with first long side 124 of base-deck frame 108 in view. FIG. 3C is an expanded view of region 300 of FIG. 3B.

As can be seen in FIG. 3C, PCBA 118 is located proximate to or on side 120 of base-deck frame 108, and is positioned such that low power consumption devices (e.g., sensor contacts, interfaces, and resistors) 301 are on a first side 302 of PCBA 118 that faces side 120 of base-deck frame 118. A first connector (e.g., a jack (J) 4 connector) 303 electrically couples circuitry (e.g., a flex circuit) within housing 102 to circuitry on PCBA 118. A second side 304 of PCBA 118, which is opposite to first side 302, includes high power consumption devices 306, which generate a substantial amount of heat. The high power consumption devices (e.g., digital signal processing chips, servo chips and power regulator chips) 306 are thermally coupled to a thermal energy transport layer 310 via a thermal contact 308. The thermal contact 308 is on a first side 312 of thermal energy transport layer 310. A second side 313 of thermal energy transport layer 310, which is opposite to the first side 312, is in contact with chassis backplane 204. A second connector (e.g., a SAS (serial attached SCSI (small computer system interface)) connector, a SATA (serial advanced technology attachment) connector, etc.) 314 electrically couples circuitry on the PCBA 118 to circuitry on the chassis backplane 204. Air or any other suitable cooling may be employed below backplane 204. In various embodiments, different types of thermal contacts 308 and thermal energy transport layers 310 may be employed. Examples of thermal contacts 308 include thermal interface materials (TIMs) such as highly conductive thermal pads, suitable gels, liquids and greases. Copper fingers may also serve as thermal contacts in some embodiments. In general, the thermal contact 308 material is selected to efficiently couple heat energy from the high power consumption devices 306 into the thermal energy transport layer 310. Examples of thermal energy transport layers 310 include copper, gold or any other suitable layers made of high thermal conductivity materials. The heat energy conducts through the thermal energy transport layer to backplane 204, where cooling from below may be applied (e.g., from space 206).

Figure 4A:
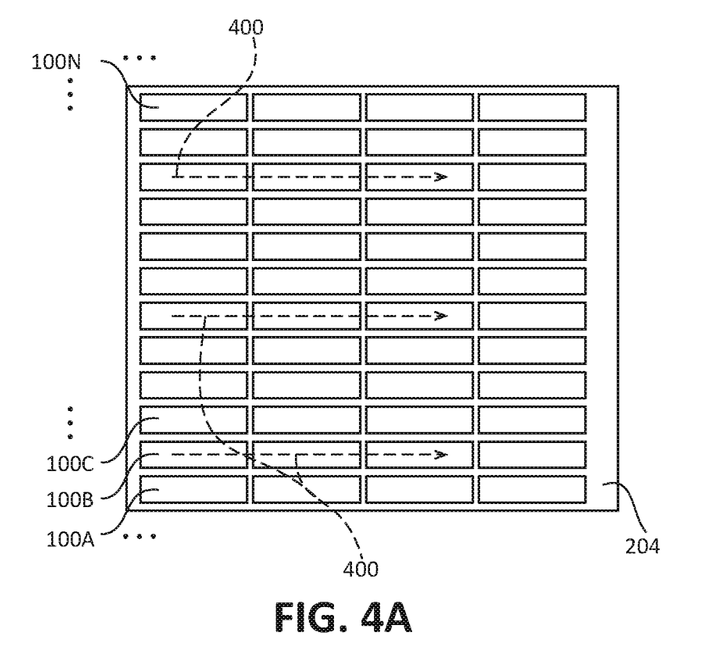
FIG. 4A is a top view of a chassis with HDDs in accordance with one embodiment.
Figure 4B:
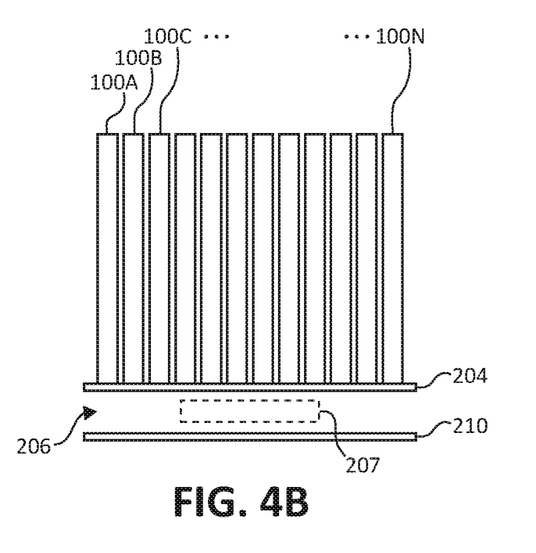
FIG. 4B is a side view of the chassis of FIG. 4A.

FIGS. 4A and 4B are top and side views, respectively, showing space 206 included between of bottom 210 of chassis 202 and backplane 204 serving as an air flow channel to provide cooling below HDDs 100A-100N. In the interest of simplification, PCBAs 118, thermal energy transport layer 310, thermal contact 308, and other details shown in FIG. 3 and not shown in FIGS. 4A and 4B. Direction 400 of air flow is only one example direction, and any suitable air flow direction or directions may be used to cool the HDDs 100A-100N. Box 207 represents any heat sinking or any other cooling apparatus that may be included in space 206.

Advantages and variations related to the above-described embodiments are included below:

1. The above-described toast architecture for the DSD (e.g., HDD) provides several benefits:

More space for structures where the PCBA used to be (e.g., coupled to the outer side of the base-deck floor 110 of HDD 100 of FIG. 1). Instead of including additional structures, for the same HDD form factor, more material may be included to improve stiffness (e.g., improve structural integrity of the base-deck floor 110 by making it thicker, for example).

Improves the ease of test card changes during manufacture. During manufacture, HDDs are tested by installing them in tester slots (not shown) and carrying out various electrical and operational tests when the HDD is in the slot. The test process may involve connecting the HDD to test cards, which may either connect to or replace the HDD's PCBA during testing. Testing HDDs in which the PCBA is connected to the base-deck floor typically necessitates removal of the HDD from the test slot in order to carry out test card changes. However, in the above-described embodiments that employ a toast architecture, the test card changes may be carried out without removing the HDD from the tester slot.

Removes the need for an interposer cards for shared electronics drive (SED) and cartridge library systems. In such systems, multiple HDDs share a single/common PCBA. To connect HDDs to the common PCBA when they are placed with the base-deck floor 110 over the common PCBA, an interposer card is included on each HDD to implement a connection between the HDD's internals and the common PCBA. However, in HDDs with a toast architecture, the connector 134 (shown in FIGS. 3A-3C) is each HDD is positioned such that direct mating of the connector 314 of the HDD and the common PCBA can take place when the HDDs are positioned over the common PCBA in the configuration shown in FIG. 2, thereby eliminating any need for interposer cards.

Since the base-deck floor 110 of the DSD (e.g., HDD) can be flat due to the absence of any PCBA connected to it, turbulence between the HDDs reduces, thereby leading to a reduction in fan requirements. It should be noted that, in some embodiments, features (e.g., channels) to improve air flow may also be added near or on the base-deck floor 110.

Handling of electronics are now focused on one surface of the HDD (e.g., surface 120 in FIGS. 3A-3C).

2. As noted above, heat transfer from the PCBA 118 of the HDD to the backplane 204 may be through thermal contact 308 and thermal energy transport layer 310. Examples of elements 308 and/or 310 include:

a copper/high thermal conductivity ground plane.
a heat sink through the PCBA 118.
cooling plane with liquid cooling.
liquid TIM (thermal interface material).
Compressive thermal pads.
Contained heat pipes with either two-phase or single-phase cooling substances enclosed.

3. In certain embodiments, some form of cooling may be applied to upper portions of HDDs (e.g., portions of the HDD above the surface to which the PCBA is attached) shown in FIG. 2.

4. Since there is a substantial thermal differential between the top and bottom of the DSD (e.g., HDDs shown in FIG. 2), a possibility for energy harvesting exists.

5. As indicated above, air flow channel or space 206 may contain heat sinking or any other cooling apparatus 207 (shown in FIG. 4B). Examples of element 207 include:

Liquid cooling channels.
Heat sink fins.
Active cooling fans.
Can directly heat sink into the backplane PCBA copper pads and planes or vias to the bottom of the backplane PCBA. A backplane PCBA typically has a ground plane and other planes with a high amount of copper. Since copper is a good thermal conductor, sinking into the planes in the PCBA enables them to serve as heat transfer planes.
Two phase cooling systems.
Heat pipes.
A combination of the above.

6. Thermal conduction vias may be formed at suitable locations in the chassis for application of the thermal contact features.

7. Although the direction of air flow is shown out of the chassis, it can be in other directions as well. For example, fans may be employed in space 206 (of FIGS. 2 and 4A) to blow air from within that space out of the chassis. Additionally, or alternatively, fans may be employed to blow air into space 206.

8. Embodiments of the disclosure are not limited to the chassis arrangement shown in FIG. 2, and may be suitable for other chassis types/arrangements.

Figure 5:
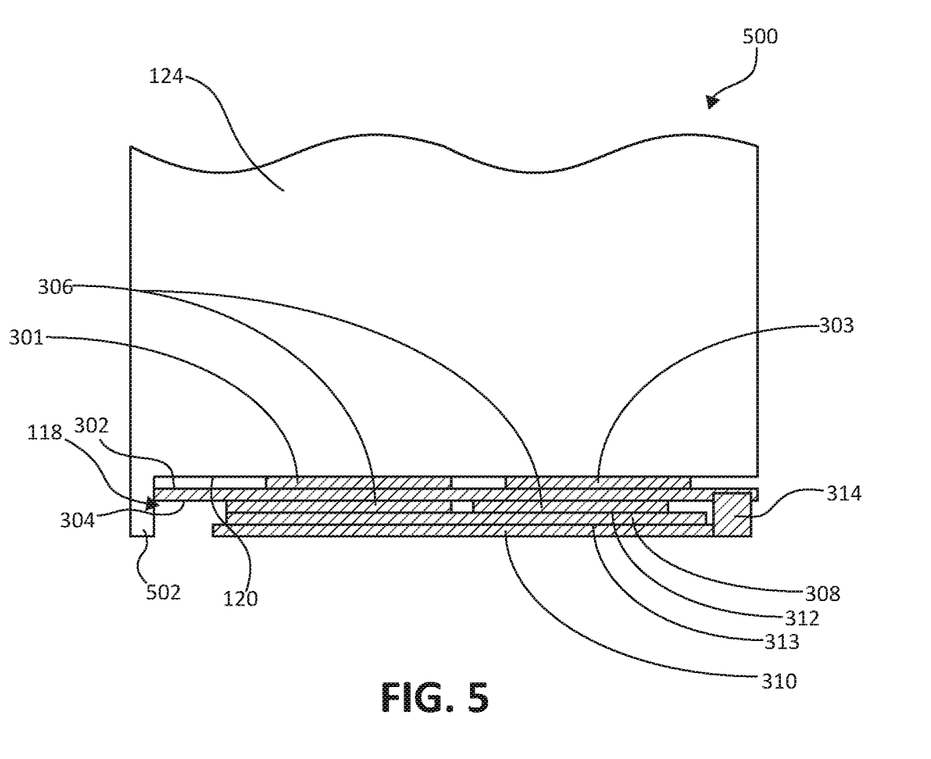
FIG. 5 is a diagrammatic illustration of a portion of an HDD in accordance with one embodiment.

9. In some embodiments, instead of attaching the thermal energy transport layer 310 to the backplane 204 as shown in FIG. 3C, layer 310 (and thermal contact 308) may be included on the HDD. Such an embodiment is shown in FIG. 5, which is a side view of an HDD 500 portion. In addition to including thermal contact 500 and thermal energy transport layer 310, HDD 500 may include a lip 502 that serves as a support structure for PCBA 118, and limits an amount of compression that may be applied to the PCBA 118. Any suitable additional cooling features may also be included in HDD 500.

In the above-described embodiments, a tombstone architecture, in which the HDDs are vertically mounted in the chassis, is employed. However, in some embodiments, the HDDs may be horizontally mounted in the chassis. Examples of such embodiments are shown in FIGS. 6 and 7, which are briefly described below.

Figure 6:
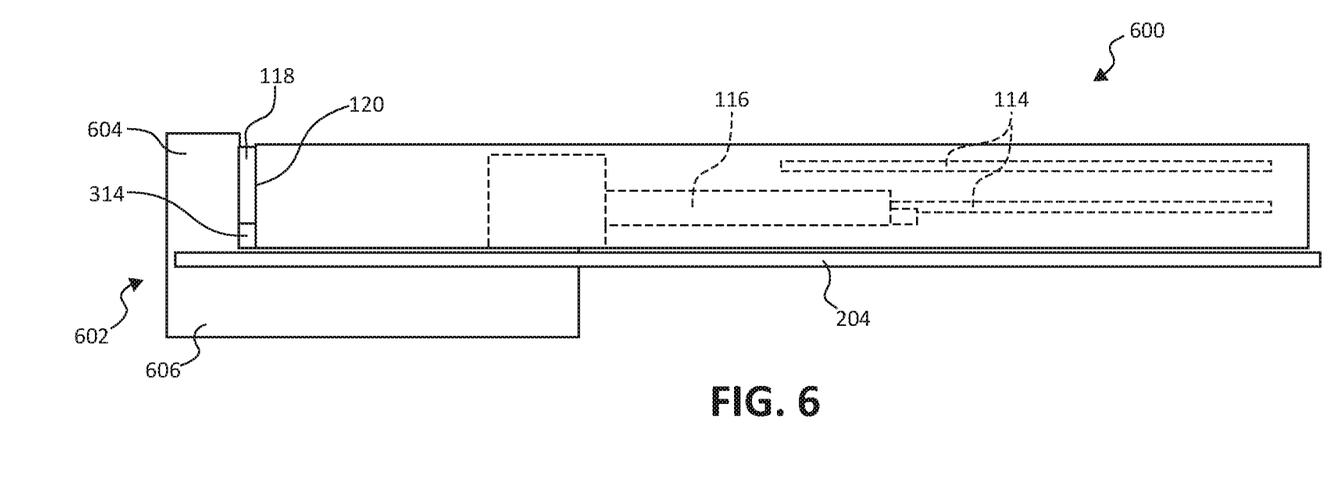
FIG. 6 is a schematic side view of an HDD positioned over a chassis backplane in accordance with another embodiment.

FIG. 6 is a schematic side view of an HDD 600 positioned over a chassis backplane 204 in accordance with another embodiment. In the interest of simplification, other components of the chassis (e.g., a chassis bottom, a cooling space/channel between the chassis bottom and the backplane, etc.) are not shown in FIG. 6. As can be seen in FIG. 6, HDD 600 has a toast architecture in which PCBA 118 is coupled to first short side 120 of base-deck frame 108. However, in the embodiment of FIG. 6, HDD 600 is mounted horizontally or flat over backplane 204. A thermal energy transport layer 602 has a vertical portion 604 that is thermally coupled to PCBA 118 and a horizontal portion 606 that is thermally coupled to backplane 204. It should be noted that a thermal contact (such as 308 of FIG. 3C) may be included between PCBA 118 and vertical thermal energy transport layer portion 604 in the embodiment of FIG. 6.

Figure 7:
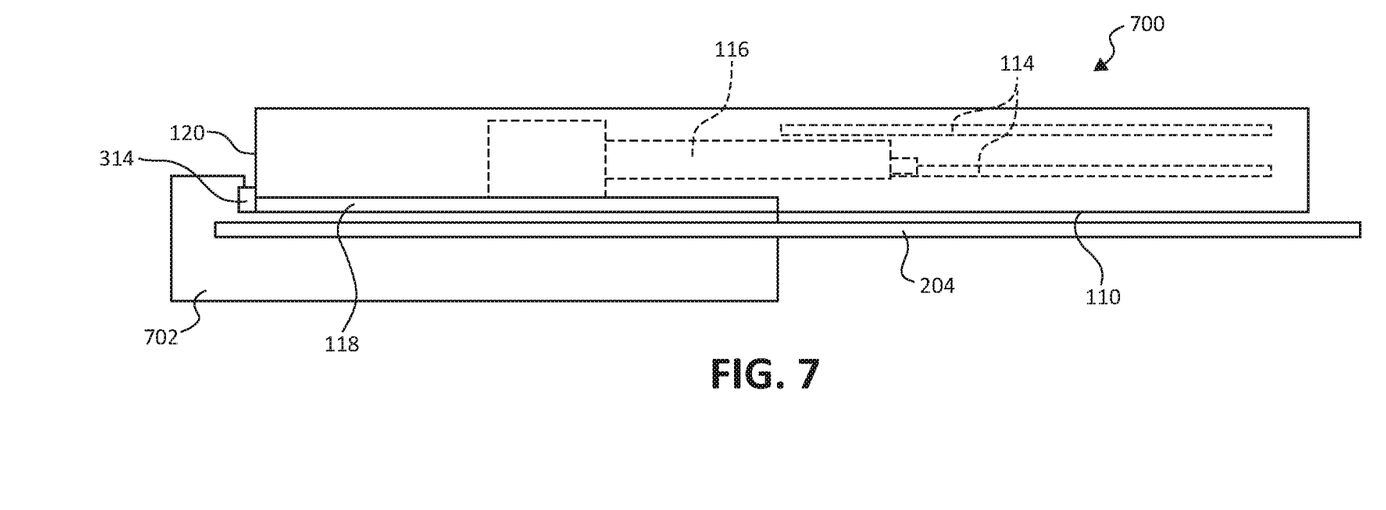
FIG. 7 is a schematic side view of an HDD positioned over a chassis backplane in accordance with another embodiment.

FIG. 7 is a schematic side view of an HDD 700 positioned over a chassis backplane 204 in accordance with another embodiment. In the interest of simplification, other components of the chassis (e.g., a chassis bottom, a cooling space/channel between the chassis bottom and the backplane, etc.) are not shown in FIG. 7. Unlike the embodiments described above, in which the HDDs have a toast architecture, HDD 700 has a PCBA 118 that is coupled to base-deck floor 110. Like HDD 600 of FIG. 6, HDD 700 is mounted horizontally over backplane 204. A thermal energy transport layer 702 is positioned horizontally between PCBA 118 and backplane 204. It should be noted that a thermal contact (such as 308 of FIG. 3C) may be included between PCBA 118 and thermal energy transport layer 702 in the embodiment of FIG. 7.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular embodiment or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments include more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A system comprising:
    a data storage device comprising:
        a housing having one or more data storage media therein, the housing including a top cover and a base-deck, the base-deck including a floor and a frame having a plurality of sides; and
        a printed circuit board assembly (PCBA) comprising a primary data storage device controller that includes electrical circuitry configured to perform overall operational control functions of the data storage device, the PCBA being mounted on an exterior of one of the plurality of sides of the frame to provide access for thermal dissipation.

2. The system of claim 1 and further comprising a chassis within which the data storage device is mounted with the PCBA facing a backplane of the chassis, the backplane being positioned proximate to a bottom of the chassis with a space between the backplane and the bottom of the chassis.

3. The system of claim 2 and further comprising a thermal energy transport layer thermally coupled to the PCBA and located between the PCBA and the backplane.

4. The system of claim 2 and wherein the space between the backplane and the bottom of the chassis comprises at least:
    one or more fluid cooling channels;
    one or more cooling fans;
    one or more heat pipes; or
    one or more heat sink fins.

5. The system of claim 3 and wherein the PCBA comprises:
    low power consumption devices on a first side of the PCBA that faces the side of the frame on which the PCBA is mounted; and
    high power consumption devices on a second side of the PCBA that is opposite the first side of the PCBA.

6. The system of claim 5 and further comprising a thermal contact between the high power consumption devices and the thermal energy transport layer.

7. The system of claim 1 and wherein the plurality of sides of the frame comprise long sides and short sides, and wherein the PCBA is mounted on an exterior of one of the short sides.

8. A method comprising:
    providing a data storage device housing with one or more data storage media therein, the housing comprising a top cover and a base-deck, the base-deck including a floor and a frame having a plurality of sides; and
    mounting a printed circuit board assembly (PCBA) comprising circuitry configured to perform overall operational functions of the data storage device on an exterior of one of the plurality of sides of the frame to provide access for thermal dissipation.

9. The method of claim 8 and further comprising mounting the data storage device housing and the PCBA in a chassis with the PCBA facing a backplane of the chassis, the backplane being positioned proximate to a bottom of the chassis with a space between the backplane and the bottom of the chassis.

10. The method of claim 9 and further comprising thermally coupling a thermal energy transport layer to the PCBA with the thermal energy transport layer located between the PCBA and the backplane of the chassis.

11. The method of claim 9 and further comprising providing, in the space between the backplane and the bottom of the chassis, at least:
    one or more fluid cooling channels;
    one or more cooling fans;
    one or more heat pipes; or
    one or more heat sink fins.

12. The method of claim 10 and further comprising:
    providing low power consumption devices on a first side of the PCBA that faces the side of the frame on which the PCBA is mounted; and
    providing high power consumption devices on a second side of the PCBA that is opposite the first side of the PCBA.

13. The method of claim 12 and further comprising providing a thermal contact between the high power consumption devices and the thermal energy transport layer.

14. The method of claim 8 and wherein the plurality of sides of the frame comprise long sides and short sides, and wherein the PCBA is mounted on an exterior of one of the short sides.

15. A system comprising:
- a data storage drive comprising:
  - a housing having one or more data storage media therein, the housing including a top cover and a base-deck, the base-deck including a floor and a frame having a plurality of sides; and
  - a printed circuit board assembly (PCBA) comprising a primary data storage device controller that includes electrical circuitry configured to perform overall operational control functions of the data storage device, the PCBA being mounted on an exterior of one of the plurality of sides of the frame or mounted on an exterior of the floor to provide access for thermal dissipation; and
- a thermal energy transport layer thermally coupled to the PCBA.

16. The system of claim 15 and further comprising a chassis within which the data storage device is mounted with the PCBA facing a backplane of the chassis, the backplane being positioned proximate to or in contact with a bottom of the chassis.

17. The system of claim 16 and wherein the thermal energy transport layer is located between the PCBA and the backplane.

18. The system of claim 16 and wherein, when the backplane is positioned proximate to the bottom of the chassis, a space between the backplane and the bottom of the chassis comprises at least:
- one or more fluid cooling channels;
- one or more cooling fans;
- one or more heat pipes; or
- one or more heat sink fins.

19. The system of claim 17 and wherein the PCBA comprises:
- low power consumption devices on a first side of the PCBA that faces the side of the frame on which the PCBA is mounted; and
- high power consumption devices on a second side of the PCBA that opposite the first side of the PCBA.

20. The system of claim 19 and further comprising a thermal contact between the high power consumption devices and the thermal energy transport layer.

* * * * *